US012062579B2

(12) United States Patent
Li

(10) Patent No.: US 12,062,579 B2
(45) Date of Patent: Aug. 13, 2024

(54) METHOD OF SIMULTANEOUS SILICIDATION ON SOURCE AND DRAIN OF NMOS AND PMOS TRANSISTORS

(71) Applicant: Applied Materials, Inc., Santa Clara, CA (US)

(72) Inventor: Xuebin Li, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 807 days.

(21) Appl. No.: 17/085,850

(22) Filed: Oct. 30, 2020

(65) Prior Publication Data

US 2022/0139784 A1    May 5, 2022

(51) Int. Cl.

| | |
|---|---|
| *H01L 21/8238* | (2006.01) |
| *C23C 16/42* | (2006.01) |
| *C23C 16/50* | (2006.01) |
| *C23C 16/52* | (2006.01) |
| *H01J 37/32* | (2006.01) |
| *H01L 21/285* | (2006.01) |

(52) U.S. Cl.
CPC ...... *H01L 21/823814* (2013.01); *C23C 16/42* (2013.01); *C23C 16/50* (2013.01); *C23C 16/52* (2013.01); *H01J 37/3244* (2013.01); *H01J 37/32715* (2013.01); *H01J 37/32834* (2013.01); *H01J 2237/3321* (2013.01); *H01L 21/28518* (2013.01)

(58) Field of Classification Search
CPC ......... H01L 21/32051; H01L 21/32053; H01L 21/823814; H01L 27/11807; H01L 29/7845; H01L 29/7848; C23C 16/42; C23C 16/50; C23C 16/52; H01J 37/3244; H01J 37/32715; H01J 37/32834
See application file for complete search history.

(56) References Cited

U.S. PATENT DOCUMENTS

| | | | | |
|---|---|---|---|---|
| 2004/0132249 | A1* | 7/2004 | Mitsuda | ............ H01L 21/26513 257/E21.336 |
| 2005/0139872 | A1* | 6/2005 | Chidambaram | ............................ H01L 21/823807 257/E21.431 |
| 2008/0102573 | A1* | 5/2008 | Liang | .................. H01L 29/7848 257/E29.267 |
| 2010/0330423 | A1* | 12/2010 | Cui | ................... H01M 10/0525 429/218.1 |

(Continued)

*Primary Examiner* — Brook Kebede

(57) ABSTRACT

A method and apparatus for the formation of a metal-oxide semiconductor FET (MOSFET) device is disclosed herein. The method of formation includes the utilization of a silicon-germanium seed layer deposited over an n-channel metal-oxide semiconductor (NMOS) device and a p-channel metal-oxide semiconductor (PMOS) device. The seed layer may be one seed layer deposited over both the NMOS source/drain regions and the PMOS source/drain regions or two doped seed layers wherein a first doped seed layer is deposited over the PMOS source/drain regions and a second doped seed layer is deposited over the NMOS source/drain regions. The seed layer enables simultaneous formation of a silicide over both the PMOS source/drain regions and the NMOS source/drain regions. The silicide formation consumes the seed layer and forms a silicide layer which varies in composition depending upon the composition of the absorbed seed layer.

16 Claims, 9 Drawing Sheets

(56) References Cited

U.S. PATENT DOCUMENTS

| | | | |
|---|---|---|---|
| 2011/0175172 A1* | 7/2011 | Matsuki | H01L 21/28088 |
| | | | 257/369 |
| 2016/0336319 A1* | 11/2016 | Yang | H01L 29/7848 |
| 2020/0013624 A1 | 1/2020 | Li et al. | |
| 2020/0091010 A1 | 3/2020 | Li et al. | |
| 2020/0283896 A1 | 9/2020 | Li et al. | |

* cited by examiner

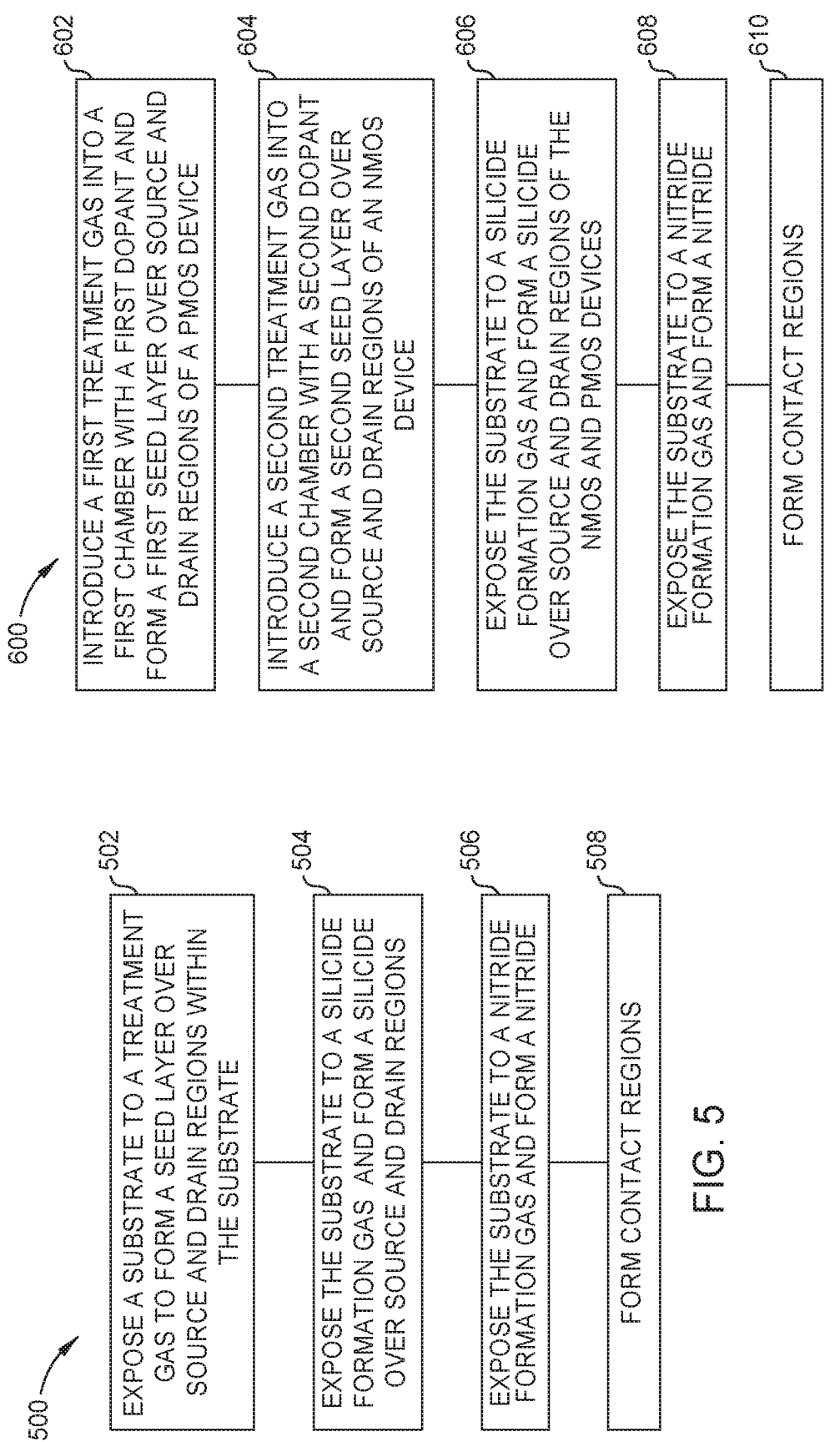

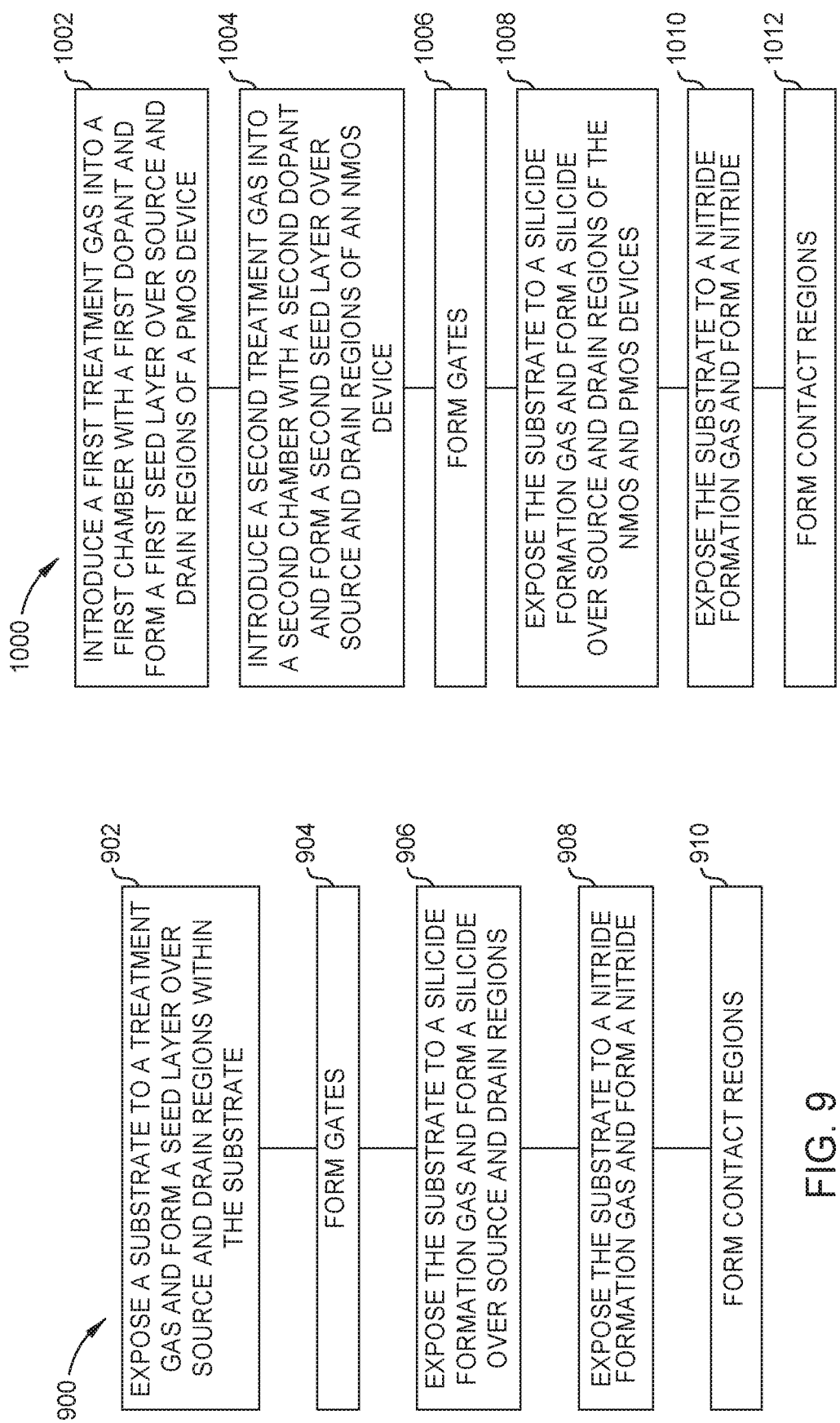

METHOD OF SIMULTANEOUS SILICIDATION ON SOURCE AND DRAIN OF NMOS AND PMOS TRANSISTORS

BACKGROUND

Field

Embodiments of the present disclosure generally relate to apparatus and methods for fabricating field-effect transistors (FETs).

Description of the Related Art

FETs are a family of transistors that rely on an electric field created by the voltage on the gate in order to control the current flow between the drain and the source. One of the many types of FETs is the metal-oxide semiconductor FET (MOSFET). The fabrication of MOSFET devices includes multiple deposition and patterning operations that are executed to form and electrically connect and/or isolate various features of the device. At least one silicide layer is typically formed on top of the source/drain regions of an n-channel metal-oxide semiconductor (NMOS) device and a p-channel metal-oxide semiconductor (PMOS) device during the MOSFET fabrication process to reduce the contact resistance between metal and source/drain regions. Nucleation of the silicide layer, which can be a metal-silicide including a polycrystalline ("poly") metal-silicide, can be challenging in light of the numerous process operations involved in MOSFET fabrication.

Typically the metal silicide layer formation is split into at least two operations to enable formation of a first silicide layer on NMOS devices and a second silicide layer on PMOS devices. Traditionally, a metal silicide is formed using an initial metal deposition/nucleation on the source/drain epitaxial film substrate using a plasma of a reactive metal source gas. The formation of the initial metal deposition/nucleation is followed by a subsequent thermal anneal for full silicidation between the metal and the epitaxial substrate. However, the formation of the metal deposition/nucleation using a plasma is non-selective and a metal film is deposited on both a dielectric surface and an epitaxial film surface of the substrate. Without plasma activation, the initial metal deposition/nucleation is difficult and the metal source material inconsistently reacts with the substrate surface for initial silicide nucleation. The quality and ease of metal silicide nucleation is highly dependent upon the characteristics of the substrate surface, the metal within the silicide, and the temperature. The use of Si, SiGe, and Ge substrates additionally alters the behavior of metal source material deposition. Ge containing substrates have been found to enhance silicide nucleation/formation even without plasma assistance. Because of the different types of epitaxial films on the source/drain regions within NMOS (Si:P, Si:CP, Si:As, etc.) and PMOS (SiGeB, Ge:B. SiGeSn:B, etc.) devices, metal silicide is separately formed on NMOS and PMOS devices under different process conditions (temperature, pressure, deposition time, etc.). It is difficult to form a silicide layer simultaneously on both NMOS and PMOS devices in a single step silicidation treatment. Enabling the formation of a silicide layer on both an NMOS and a PMOS device simultaneously reduces formation time of the MOSFET devices.

Therefore, there remains a need for processes and apparatus for the formation of a silicide film simultaneously on both the NMOS and the PMOS devices using a single silicidation treatment.

SUMMARY

Embodiments disclosed herein generally relate to a method of processing a substrate. The method includes positioning a substrate having an n-channel metal-oxide semiconductor (NMOS) device and a p-channel metal-oxide semiconductors (PMOS) device disposed thereon into a processing chamber. Subsequent to positioning the substrate into the processing chamber a seed layer is deposited simultaneously over an NMOS source/drain region of the NMOS device and a PMOS source/drain region of the PMOS device. The seed layer includes both silicon and germanium. A metal silicide is simultaneously deposited over the NMOS source/drain region and the PMOS source/drain region after depositing the seed layer.

In another embodiment, the method of processing a substrate includes positioning a substrate having an n-channel metal-oxide semiconductor (NMOS) device and a p-channel metal-oxide semiconductors (PMOS) device disposed thereon into a first processing chamber. After positioning the substrate, a first seed layer is selectively deposited over an NMOS source/drain region of the NMOS device within the first processing chamber. The first seed layer includes both silicon and germanium. A second seed layer is selectively deposited over a PMOS source/drain region of the PMOS device. The second seed layer includes both silicon and germanium. A metal silicide is deposited simultaneously over the NMOS source/drain and the PMOS source region after depositing the first seed layer and the second seed layer. The first seed layer and the second seed layer are consumed during the deposition of the metal silicide.

In yet another embodiment, a system for substrate processing is described. The system includes a first process chamber. The first process chamber includes a chamber body, a substrate support, a first chamber lid, one or more process gas inlets, and one or more exhaust ports. The system further includes a controller. The controller is configured to perform a method. The method includes depositing a seed layer on a substrate disposed within the chamber body, wherein the depositing of the seed layer is performed over an NMOS source/drain region and a PMOS source/drain region within the substrate. The seed layer includes both silicon and germanium. The method further includes depositing a metal silicide simultaneously over the NMOS source/drain regions and the PMOS source/drain regions after depositing the seed layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 5 is a flow chart of a method of forming a portion of a MOSFET device according to embodiments of the present disclosure.

FIG. 6 is a flow chart of another method of forming a portion of a MOSFET device according to embodiments of the present disclosure.

FIG. 9 is a flow chart of yet another method of forming a MOSFET device according to embodiments of the present disclosure.

FIG. 10 is a flow chart of yet other methods of forming a MOSFET device according to embodiments of the present disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure includes methods and apparatus for improving the MOSFET fabrication process. The MOSFET fabrication process is improved by simplifying the silicidation integration flow and reducing the dependence of silicidation on substrate surface element composition within the NMOS and the PMOS source/drain regions (such as Si:P, Si:CP, Si:As films for NMOS and SiGe:B; Ge:B; SiGeSn:B films for pMOS). In embodiments described herein, the silicidation operation is performed simultaneously over the NMOS and the PMOS source/drain regions and a seed layer is consumed.

The silicidation operation is performed using a single deposition operation after a seed layer of silicon-germanium (SiGe) or doped silicon-germanium (e.g., SiGeB or SiGeP) is deposited on the source/drain regions of both the NMOS and PMOS devices. The seed layer enables simultaneous formation of the silicide on both the NMOS and PMOS source/drain regions. The seed layer is consumed during the deposition of silicide and forms a metal germanosilicide on both the NMOS and PMOS devices.

Figure 1:
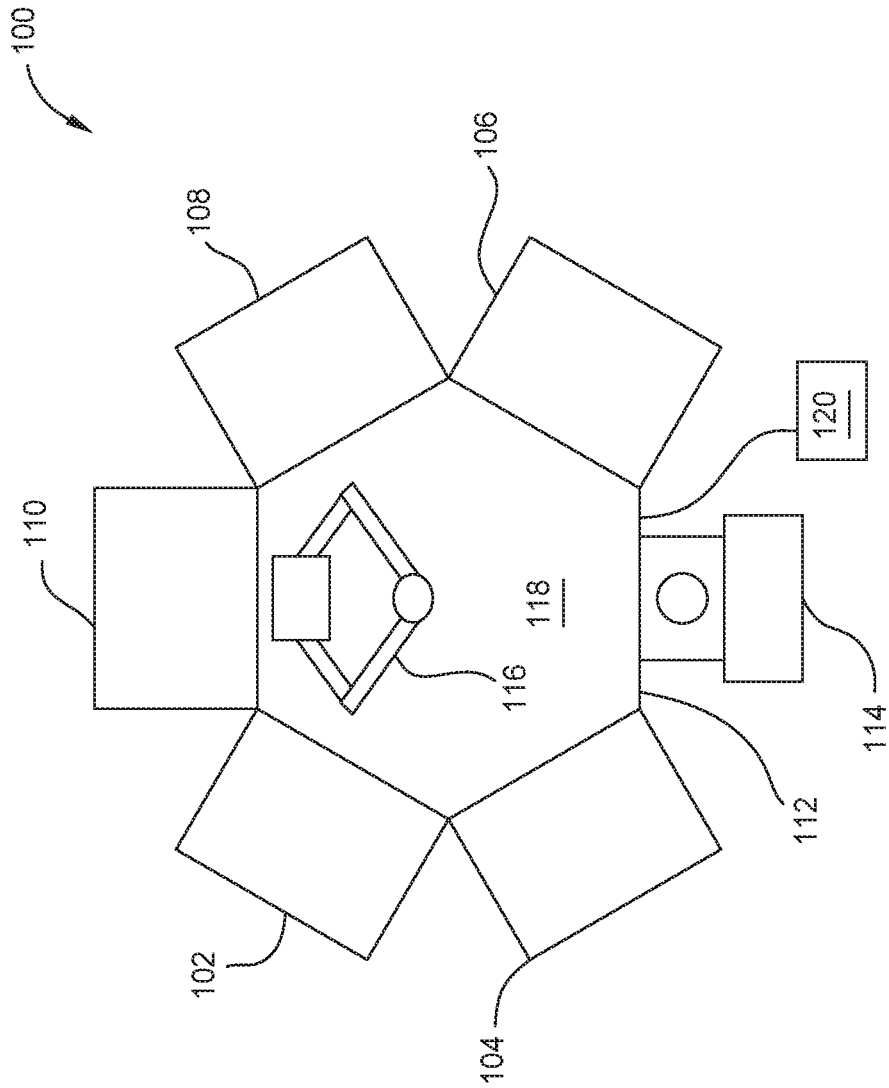
FIG. 1 is a schematic illustration of a system for forming semiconductor components according to embodiments of the present disclosure.
Figure 2A:
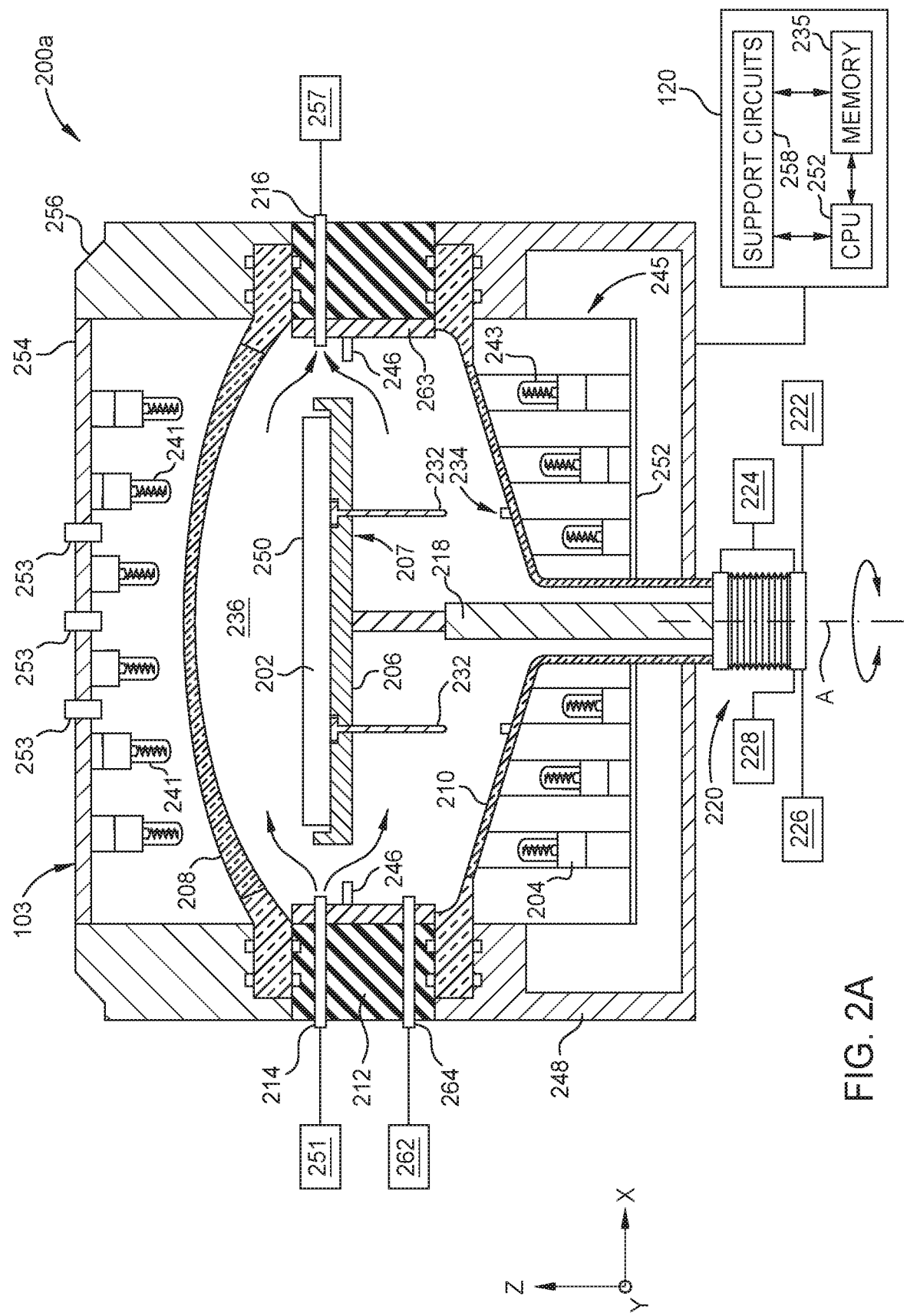
FIG. 2A is a schematic illustration of a first type of deposition chamber according to embodiments of the present disclosure.

FIG. 1 is a schematic illustration of a system 100 for forming semiconductor components, such as MOSFET devices, according to embodiments of the present disclosure. The system 100 is a cluster tool that includes a first chamber 102, a second chamber 104, a third chamber 106, a fourth chamber 108, a fifth chamber 110, and a central transfer chamber 112 that defines a transfer space 118 that contains a central transfer robot 116. The system 100 further includes a controller 120 coupled to the system 100. The controller is programmed to execute a plurality of instructions for the operation of the system 100 to fabricate MOSFET devices, including operation of the central transfer robot 116 as well as operation of the chambers 102-110 and a loading chamber 114. As shown in FIG. 2A, the controller 120 includes a programmable central processing unit (CPU) 252 that is operated with a memory 235 and a mass storage device, an input control unit, and a display unit (not shown). The controller 120 includes hardware for monitoring substrate processing through sensors in the process chambers and monitors the precursor, process gas, and purge gas flow. Support circuits 258 are coupled to the CPU 252 for supporting the processor in a conventional manner. The central transfer robot 116 is configured to transfer substrates between the loading chamber 114 and the one or more chambers 102-110 through the transfer space 118.

While not shown in FIG. 1, chambers 102, 104, 106, 108, and/or 110 of the system 100 can further include one or more remote plasma sources, and one or more gas sources for precursor gases, carrier gases, and other process gases. The system 100 can also include a plurality of components such as sensors and controls configured to measure and control pressure, temperature, gas flow, and gas composition in some or all of the chambers 102-110. The system 100 can thus be configured to form desired structures and devices, including MOSFET devices such as NMOS and PMOS devices. In one example, one or more of the chambers 102-110 is held under vacuum pressure, and the substrates moved therebetween are not exposed to ambient air. In an embodiment, MOSFET devices are fabricated using the system 100 in a plurality of operations. The substrate can be moved among and between one or more chambers 102-110. In one embodiment, the first chamber 102 is thus used for silicide operations. In one example, when the first chamber 102 is a metal-silicide formation chamber, the substrates are transferred through the transfer space 118 and are not exposed to ambient air during transfer to/from the first chamber 102. In some embodiments, the first chamber 102 is used for silicide operations including metal-silicide formation using, for example, a CVD process.

In an embodiment, the first chamber 102 is a metal-silicide deposition chamber that can be, in one example, a chemical vapor deposition (CVD) chamber. The second chamber 104 is an NMOS chamber, such as that used for source-drain epitaxy (e.g., an epitaxial deposition chamber), and may be coupled to one or more precursor sources of Si, P, C and/or As for NMOS formation. The third chamber 106 is a PMOS chamber, such as that used for source-drain epitaxy, and may be coupled to one or precursor sources of Si, Ge, and/or B for PMOS formation. The fourth chamber 108 is a plasma chamber to which sources of dopants, as well as sources of Ar and He gas, may be introduced to facilitate plasma ignition in the fourth chamber. The plasma chamber can be used for various MOSFET fabrication operations, including etching operations. The fifth chamber 110 is a pre-clean chamber such that oxides may be removed from the substrate surface prior to or during operations in the MOSFET device fabrication process.

In one example, PMOS devices can be fabricated in chambers of the system 100 including the third chamber 106, and NMOS devices can be fabricated in chambers including the second chamber 104. Both NMOS and PMOS devices, as well as other types of MOSFET devices, can be fabricated using either the third chamber 106 or the second chamber 104 in addition to one or more of the first chamber 102 when configured as a metal-silicide formation chamber, the fourth chamber 108 when configured as a plasma chamber, or the fifth chamber 110 when configured as a pre-clean chamber. That is, various combinations of the chambers 102-108 can be used to fabricate NMOS or PMOS devices depending upon the embodiment.

A metal silicide formation operation, as discussed herein, can be performed in the first chamber 102 when the first chamber 102 is configured as a metal-silicide deposition chamber. The process can alternatively be performed in a metal-silicide deposition chamber, after a seed layer deposition operation is performed. The seed layer deposition operation may be performed in the third chamber 106 (when the third chamber 106 is configured as a PMOS chamber). The use of the chambers 102-110 in the system 100 are discussed in detail below.

FIG. 2A is a schematic illustration of a first type of deposition chamber 200a according to embodiments of the present disclosure. The deposition chamber 200a can be any one of the chambers 102-106 within FIG. 1. The deposition chamber 200a is an epitaxial deposition chamber and is therefore typically used as the second chamber 104 and/or the third chamber 106 within the system 100. The deposition chamber 200a is utilized to grow an epitaxial film on a substrate, such as the substrate 202. The deposition chamber 200a creates a cross-flow of precursors across the top surface 250 of the substrate 202.

The deposition chamber 200a includes an upper body 256, a lower body 248 disposed below the upper body 256, a flow module 212 disposed between the upper body 256 and the lower body 248. The upper body 256, the flow module 212, and the lower body 248 form a chamber body. Disposed within the chamber body is a substrate support 206, an upper dome 208, a lower dome 210, a plurality of upper lamps 241, and a plurality of lower lamps 243. As shown, the controller 120 is in communication with the deposition chamber 200a and is used to control processes, such as those described herein. The substrate support 206 is disposed between the upper dome 208 and the lower dome 210. The plurality of upper lamps 241 are disposed between the upper dome 208 and a lid 254. The lid 254 includes a plurality of sensors 253 disposed therein for measuring the temperature within the deposition chamber 200a. The plurality of lower lamps 243 are disposed between the lower dome 210 and a floor 252. The plurality of lower lamps 243 form a lower lamp assembly 245.

A processing volume 236 is formed between the upper dome 208 and the lower dome 210. The processing volume 236 has the substrate support 206 disposed therein. The substrate support 206 includes a top surface on which the substrate 202 is disposed. The substrate support 206 is attached to a shaft 218. The shaft is connected to a motion assembly 220. The motion assembly 220 includes one or more actuators and/or adjustment devices that provide movement and/or adjustment of the shaft 218 and/or the substrate support 206 within the processing volume 236. The motion assembly 220 includes a rotary actuator 222 that rotates the shaft 218 and/or the substrate support 206 about a longitudinal axis A of the deposition chamber 200. The motion assembly 220 further includes a vertical actuator 224 to lift and lower the substrate support 206 in the z-direction. The motion assembly includes a tilt adjustment device 226 that is used to adjust the planar orientation of the substrate support 206 and a lateral adjustment device 228 that is used to adjust the position of the shaft 218 and the substrate support 206 side to side within the processing volume 236.

The substrate support 206 may include lift pin holes 207 disposed therein. The lift pin holes 207 are sized to accommodate a lift pin 232 for lifting of the substrate 202 from the substrate support 206 either before or after a deposition process is performed. The lift pins 232 may rest on lift pin stops 234 when the substrate support 206 is lowered from a processing position to a transfer position.

The flow module 212 includes a plurality of process gas inlets 214, a plurality of purge gas inlets 264, and one or more exhaust gas outlets 216. The plurality of process gas inlets 214 and the plurality of purge gas inlets 264 are disposed on the opposite side of the flow module 212 from the one or more exhaust gas outlets 216. One or more flow guides 246 are disposed below the plurality of process gas inlets 214 and the one or more exhaust gas outlets 216. The flow guide 246 is disposed above the purge gas inlets 264. A liner 263 is disposed on the inner surface of the flow module 212 and protects the flow module 212 from reactive gases used during deposition processes. The process gas inlets 214 and the purge gas inlets 264 are positioned to flow a gas parallel to the top surface 250 of a substrate 202 disposed within the processing volume 236. The process gas inlets 214 are fluidly connected to a process gas source 251. The purge gas inlets 264 are fluidly connected to a purge gas source 262. The one or more exhaust gas outlets 216 are fluidly connected to an exhaust pump 257.

Figure 2B:
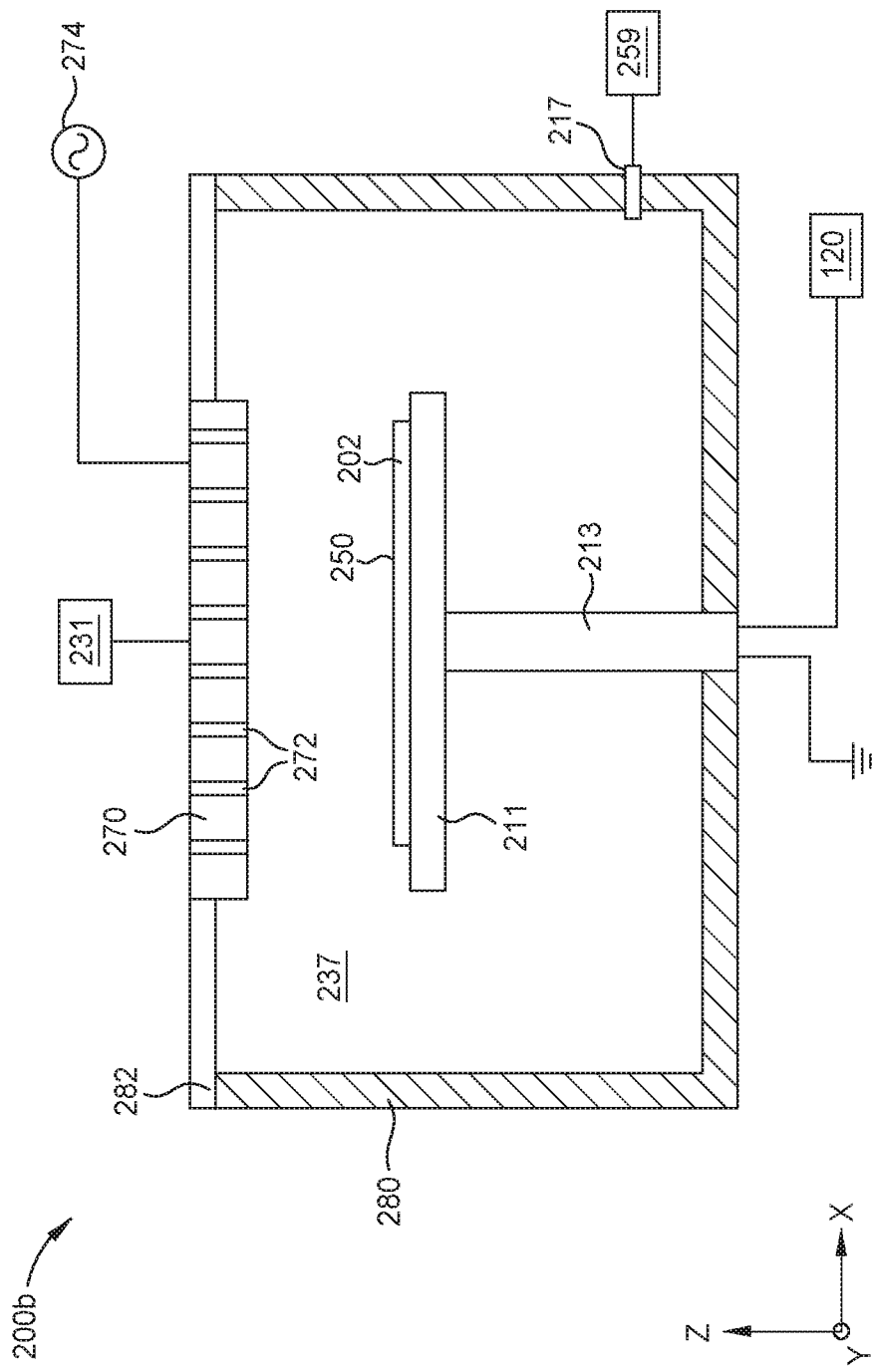
FIG. 2B is a schematic illustration of a second type of deposition chamber according to embodiments of the present disclosure.

FIG. 2B is a schematic illustration of a second type of deposition chamber 200b according to embodiments of the present disclosure. The deposition chamber 200b can be any one of the chambers 102-108 within FIG. 1. The deposition chamber 200b is a chemical vapor deposition (CVD) chamber and is therefore typically used as the first chamber 102 within the system 100. The deposition chamber 200b is utilized to grow a silicide on a substrate, such as the substrate 202.

The deposition chamber 200b includes a chamber body 280, a chamber lid 282, a showerhead 270, a substrate support 211, and an exhaust outlet 217. The chamber body 280, the chamber lid 282, and the showerhead 270 define a processing volume 237. The chamber lid 282 is disposed on top of the chamber body 280 with the showerhead 270 either disposed underneath or within the chamber lid 282.

The showerhead 270 may alternatively be a plate stack and is not limited to the showerhead design disclosed herein. The showerhead 270 includes one or more apertures 272 through which a process gas is flown into the processing volume 237. The process gas may be flown from a process gas source 231 into the processing volume 237. The process gas source 231 controls the quantity and flow rate of the process gas into the processing volume 237. The process gas source 231 is configured to deliver a silicon containing and/or a metal containing precursor. The process gas source 231, in some embodiments, may include multiple process gas sources 231, such that the process gas source 231 is a gas panel. The showerhead 270 is connected to a radio frequency (RF) power source 274. The RF power source 274 is configured to provide a bias between the substrate support 206 and the showerhead 270. Alternatively, the RF power source 274 may be connected to the substrate support 206 and the showerhead 270 may be grounded.

The substrate support 211 is disposed within the processing volume 237 and is configured to support a substrate such as the substrate 202. The substrate support 211 includes a planar upper surface sized to receive the substrate 202. The substrate support 211 is connected to a shaft 213. The shaft 213 extends from the bottom side of the substrate support 211 and is configured to be raised, lowered, or rotated. In some embodiments, the shaft 213 and the substrate support 211 are connected to one or more motors or actuators in a similar fashion to the shaft 218 and the substrate support 206 of the deposition chamber 200a of FIG. 2A. The shaft 213 and the substrate support 211 are grounded.

The exhaust outlet 217 is connected to both the processing volume 237 and an exhaust pump 259. The exhaust outlet 217 and the exhaust pump 259 remove gases from the processing volume 237. The exhaust outlet 217 is disposed through the chamber body 280.

Figure 3A:
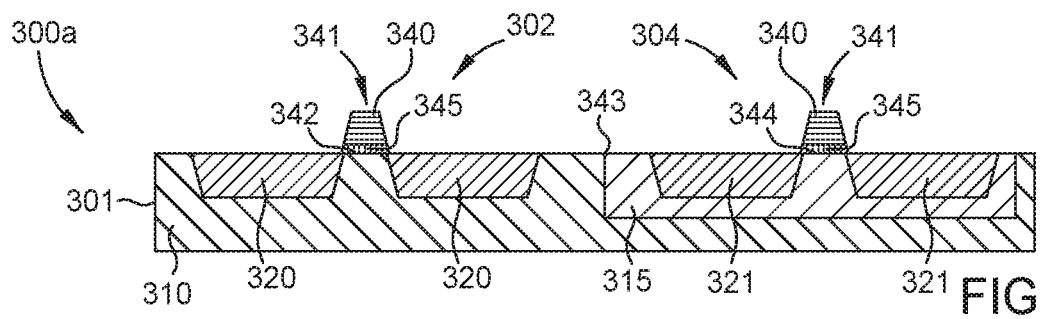
FIGS. 3A-3D are partial schematic illustrations of MOSFET device formation operations according to embodiments of the present disclosure.

FIGS. 3A-3D are partial schematic illustrations of MOSFET device 300a formation according to embodiments of the present disclosure. FIG. 5 shows a method 500 used to form the MOSFET device 300a. The MOSFET device 300a of FIG. 3A is shown after the formation of NMOS source/drain regions 320, PMOS source/drain regions 321, as well as a gate within a substrate 301, such as the substrate 202. The NMOS source/drain regions 320 are disposed within a p-well region 310. The PMOS source/drain regions 321 are disposed within an n-well region 315. There may be a plurality of MOSFET devices 300a within a single substrate 301, such that there are a plurality of NMOS source/drain regions 320 and a plurality of PMOS source/drain regions 321 within the substrate 301.

The NMOS source/drain regions 320 as well as the p-well region 310 are part of an NMOS device 302. The PMOS source/drain regions 320 as well as the n-well region 315 are part of a PMOS device 304. A gate 341 is disposed on a first surface 342 of the substrate 301 between the NMOS source/drain regions 320. Another gate 341 is disposed on a second surface 344 of the substrate 301 between the PMOS source/drain regions 321. A third surface 343 of the substrate 301 is disposed between the NMOS device 302 and the PMOS device 304. The third surface 343 in some embodiments may include additional device features or layers.

The gates 341 include an intermediate layer 345 and a gate device 340. In some embodiments, the gates 341 are high-k metal gates. The intermediate layer 345 is disposed on the first surface 342 and the second surface 344 between both the NMOS and the PMOS source/drain regions 320, 321. The intermediate layer 345 may include a polysilicon material and/or an insulating material. In some embodiments, the insulating material is silicon oxide, silicon nitride, silicon oxynitride, hafnium oxide, hafnium aluminum oxide, nitrided hafnium silicates, or combinations thereof. The gate device 340 is formed on the intermediate layer 345 disposed on the substrate 301 and includes off-set layers deposited on the sides of the gate (not shown). The gate device 340 may include a polysilicon, a silicide material, or a metal material. Exemplary materials found within the gate device 340 include tantalum, tungsten, tungsten nitride, tantalum nitride, or titanium nitride. Metals such as aluminum may also be included in the gate device in combinations with other materials. The gate device 340 may include a gate metal layer, a gate material layer, and a metal material. The gate metal layer includes any one of the tantalum, tungsten, tungsten nitride, tantalum nitride, or titanium nitride. The gate material layer may be a polysilicon layer. The metal material may be a highly conductive metal, such as aluminum, copper, tungsten, silver, gold, and other similar materials. The metal material may also be an alloy of any of the highly conductive metals described. The gates 341 illustrated herein are not meant to be limiting and may include a variety of additional materials and structures. In some embodiments, at least a portion of the gate 341 is formed at a temperature of about 800° C. to about 1000° C., such as about 850° C. to about 950° C. After the formation of the gates 341, an etch process may take place to remove dielectric layers from over the NMOS and the PMOS source/drain regions 320, 321. There may be at least one thermal treatment performed during the formation of the gates 341.

The NMOS source/drain regions 310 and the PMOS source/drain regions 321 are formed within an epitaxial deposition chamber such as the deposition chamber 200a of FIG. 2A. The NMOS source/drain regions 320 may be formed within the second chamber 104. The PMOS source/drain regions 321 may be formed within the third chamber 106. The NMOS source/drain regions 320 are doped with phosphorous and/or arsenic, such that the NMOS source/drain regions 320 comprise silicon and a dopant of phosphorous and/or arsenic. The PMOS source/drain regions 321 are doped with germanium, tin, and/or boron, such that the PMOS source/drain regions 321 comprise silicon and a dopant of germanium and/or boron. Therefore the NMOS source/drain regions 320 may comprise a Si:P or an Si:As composition while the PMOS source/drain regions 321 comprise a SiGeB, a SiGe, a GeB, or a GeSnB composition. The NMOS source/drain regions 320 and the PMOS source/drain regions 321 have a crystalline structure.

Figure 3B:
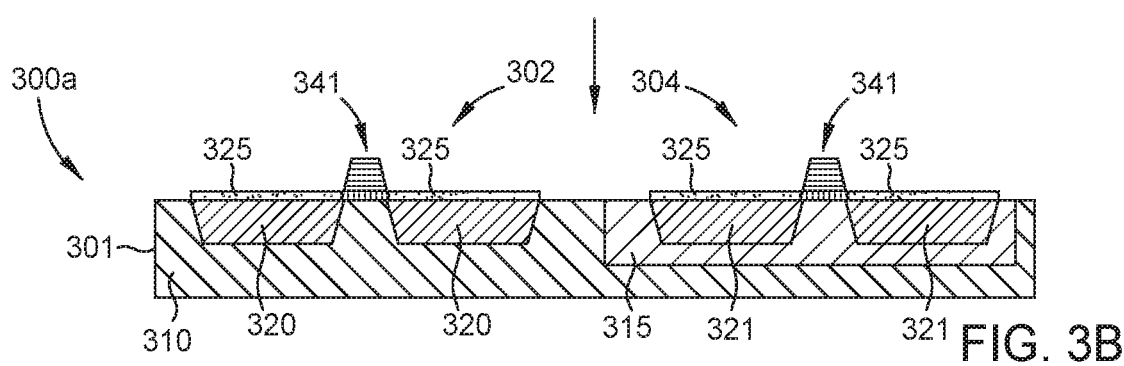

FIG. 3B shows the MOSFET device 300a after the deposition of a seed layer 325. The seed layer 325 deposition is performed during a first operation 502 of the formation method 500 shown in FIG. 5. During the first operation 502, the surface of the substrate 301 is exposed to a treatment gas. The treatment gas may comprise a silicon containing gas and a germanium containing gas. Exemplary treatment gases include one or a combination of dichlorosilane, silane, disilane, trichlorosilane, germane, digermane, or germanium tetrachloride. The treatment gas is introduced into the processing volume of a deposition chamber, such as the processing volume 236 of deposition chamber 200a, through a process gas inlet, such as the process gas inlet 214. The treatment gas is introduced by either one or multiple inlets. In embodiments described herein, the treatment gas is introduced using multiple process gas inlets and flown parallel to the top surface of the substrate 301. As the treatment gas is flown into the chamber, the silicon and germanium of the treatment gas is deposited to form the seed layer 325 (alternatively described as a thin layer) over the both the NMOS source/drain regions 320 and the PMOS source/drain regions 321. During the first operation 502 of depositing the seed layer 325, the process chamber, such as a first epitaxial deposition chamber (e.g., deposition chamber 200a), is held at a temperature of less than about 550° C., such as less than about 500° C., such as less than about 450° C. In some embodiments, the seed layer 325 is deposited at a temperature between about 550° C. and about 400° C., such as about 500° C. and about 400° C. The process chamber is also held at a pressure of about 5 Torr to about 300 Torr during the deposition of the seed layer 325, such as at about 10 Torr to about 100 Torr.

In the first operation 502, the seed layer 325 is formed to a thickness of about 1 nm to about 6 nm, such as about 2 nm to about 5 nm, such as about 2.5 nm to about 5 nm. In some embodiments, the seed layer 325 is about half the thickness of a silicide layer 330 formed in a second operation 504, such as less than about 60% of the thickness of the silicide layer 330. The seed layer 325 is deposited using an epitaxial deposition process and is therefore selectively deposited onto both the NMOS source/drain regions 320 and the PMOS source/drain regions 321. The seed layer 325 includes a composition of about 5%-75% germanium, such as about 10% to about 60% germanium, such as about 10% to about 50% germanium, such as about 10% to about 40% germanium, such as about 10% to about 30% germanium.

The germanium concentration within the silicon-germanium (SiGe) seed layer has been determined to allow silicidation for both PMOS and NMOS source/drain regions 320, 321. The germanium concentration is chosen to improve silicide film morphology/uniformity with reduced agglomeration of germanium. The germanium concentration is also chosen to meet contact resistance reduction specifications at the interface for both NMOS and PMOS devices. It has been found that when deposited on PMOS source/drain regions 321, germanium concentrations of about 10% to about 30% can be used as a seed layer to maintain silicide morphology and uniformity at an interface. Also at germanium concentrations of about 10% to about 30%, the seed layer 325 has been found to enhance silicide nucleation on the NMOS source/drain regions 321. The seed layer 325 of FIG. 3B and FIG. 5 is an undoped seed layer and typically consists of or consists essentially of silicon and germanium.

After the deposition of the seed layer 325 during the first operation 502, the flow of the treatment gas may be ceased and the process volume purged. The process volume may be pumped to a transfer pressure and the substrate 301 may be removed from the first epitaxial deposition chamber, such as the deposition chamber 200a. The substrate 301 may be moved to a second epitaxial deposition chamber or to a CVD process chamber for the second operation 504. In other embodiments, the substrate 301 may remain in the first epitaxial deposition chamber and the second operation 504 is performed within the first epitaxial deposition chamber.

During the second operation 504, the substrate 301 is exposed to a silicide formation gas. The silicide formation gas may include a combination of silicon, germanium, and a metal material. The metal material may be any one of titanium, nickel, cobalt, platinum, nickel, or an alloy thereof. The silicide formation gas is introduced at a temperature of less than about 500° C., such as less than about 450° C., such as less than about 400° C. The second operation, as described herein, is performed in one of the first epitaxial deposition chamber (e.g., deposition chamber 200a), the second epitaxial deposition chamber (e.g., deposition chamber 200a), or the CVD process chamber (e.g., deposition chamber 200b). The process chamber is also held at a pressure of about 3 Torr to about 300 Torr during the exposure to the silicide formation gas, such as at about 5 Torr to about 100 Torr.

Figure 3C:
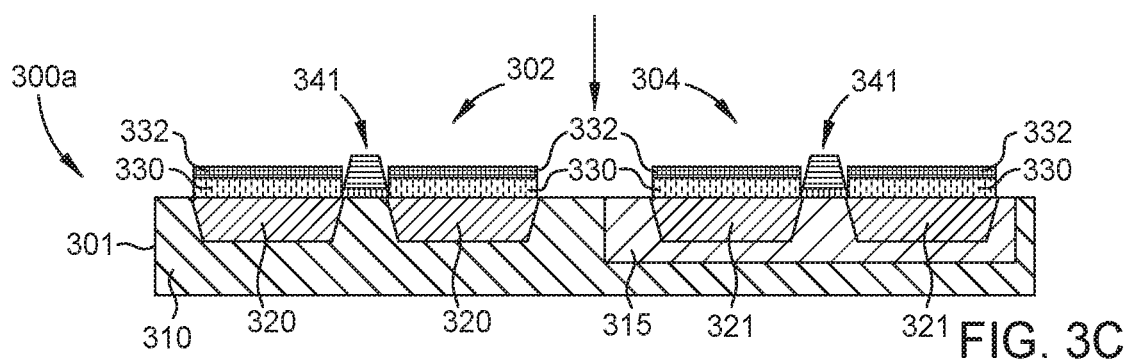

As the silicide formation gas is flown into the process chamber, the silicon, germanium, and the metal material of the silicide formation gas are reacted to form a metal germanosilicide on top of source/drain regions. As described in the second operation 504, a silicide layer 330 is formed over each of the NMOS source/drain regions 320 and the PMOS source/drain regions 321. The silicide layer 330 is shown in FIG. 3C and consumes the seed layer 325 fully. The NMOS source/drain regions 320 and the PMOS source/drain regions 321 may be slightly reacted and consumed during silicidation after seed layer 325 has been fully reacted and consumed by the formation of the silicide layer 330. The seed layer 325 is consumed fully as any residual seed layer causes increased resistance of the transistor. The silicide layer 330 is selectively deposited onto each of the NMOS source/drain regions 320 and the PMOS source/drain regions 321 simultaneously. The use of a seed layer 325 with similar composition and physical properties on both the NMOS source/drain regions 320 and the PMOS source/drain regions 321 enables the simultaneous deposition of the silicide layer 330. The seed layer 325 improves the selectivity over both the NMOS source/drain regions 320 and the PMOS source/drain regions while at the same process conditions and while using the same precursors. The simultaneous deposition of the silicide layer 330 assists in obtaining similar silicide thicknesses and properties. Simultaneous deposition of the silicide layer 330 additionally reduces the number of process steps for forming the MOSFET device 300a.

The silicide layer 330 is formed to a thickness of about 4 nm to about 12 nm, such as about 5 nm to about 10 nm, such as about 6 nm to about 9 nm. In some embodiments the silicide layer 330 is about twice the thickness of the seed layer 325 formed in first operation 502, such as greater than about 200% of the thickness of the seed layer 325. The silicide layer 330 is deposited using either an epitaxial deposition process or a CVD process and is therefore selectively deposited onto the seed layer 325 over both the NMOS source/drain regions 320 and the PMOS source/drain regions 321. In some embodiments, the silicide layer 330 is formed using a plasma CVD process, but the plasma CVD process is non-selective.

Depositing the silicide layer 330 in an epitaxial deposition chamber is beneficial in that the silicide layer 330 is highly selective during deposition. The silicide layer 330 is only formed over the NMOS source/drain regions 320 and the PMOS source/drain regions 321 by the reaction with the seed layer 325, and does not form a silicide layer 330 over other exposed portions of the substrate 301 or the gate 341. Utilizing an epitaxial deposition chamber additionally allows for the same chamber to be used for seed layer 325 deposition as well as silicide layer 330 formation. Contact resistance at the interface of the silicide layer and the seed layer 325 is able to be tuned by the concentration of dopants, layer thickness, and germanium concentration. Deposition of the silicide has additionally been shown to consume a small portion of the substrate 301 after the full consumption of seed layer and allows for conformal growth of the silicide layer 330 over the source/drain regions 320, 321. While thermal CVD selectively deposits the silicide layer 330 and shows good nucleation and film morphology, plasma CVD processes have been shown to be non-selective because of the formation of very reactive metal sources by plasma.

The silicide layer 330 includes a composition of about 35% to about 65% metal material, such as about 40% to about 60% metal material, such as about 45% to about 55% metal material, such as about 50% metal material. The silicide layer 330 may further include about 5%-65% germanium, such as about 10% to about 45% germanium, such as about 25% to about 40% germanium. The silicide layer 330 may further include about 5%-65% silicon, such as about 10% to about 45% silicon, such as about 25% to about 40% silicon. The silicide layer 330 of FIG. 3C and FIG. 5 may be a titanium containing layer, such as a Ti—Si—Ge layer. Additional silicide layer 330 materials may include NiSi, TiSi, $TiSi_2$, NiGe, TiGe, or $TiGe_2$. The ratio of metal to silicon or metal to germanium for the embodiments of the silicide layer described above are about 0.2:1 to about 2:1, such as about 0.5:1 to about 1.5:1, such as about 0.5:1 to about 1:1.

In the third operation 506, a nitride layer 332 is deposited on the silicide layer 330. In certain embodiments, the nitride layer 332 is formed using an $N_2$ precursor, an $H_2$ precursor, and/or an $NH_3$ precursor. In certain embodiments, the $N_2$ precursor, $H_2$ precursor, and/or $NH_3$ precursor may be converted to a plasma during the nitride layer 332 deposition. The nitride layer 332 is a metal nitride layer, as some of the metal material from the silicide layer 330 is consumed by the nitride layer 331 during nitride layer 332 formation. The nitride layer 332, in some embodiments, is a titanium nitride (TiN) layer. The nitride layer 332 is deposited to protect the top of the silicide layer 330 from oxidizing when exposed to atmosphere. The nitride layer 332 additionally helps metal wetting on dielectric sidewalls during contact metal fills as described herein. The nitride layer 332 may have a thickness of about 1 to 6 nm, such as about 2 to 5 nm. In one embodiment, the nitride layer 332 is performed in a plasma CVD process chamber, e.g., deposition chamber 200b of FIG. 2B. Therefore, if the substrate 301 is disposed within either the first epitaxial deposition chamber or the second epitaxial deposition chamber, the substrate 301 is moved to a first CVD process chamber or to a direct plasma nitridation (DPN) chamber for deposition of the nitride layer 332. If the substrate 301 is already within a CVD process chamber, the nitride layer 332 may be formed within the same CVD process chamber or a different CVD process chamber, such as a second CVD process chamber.

Figure 3D:
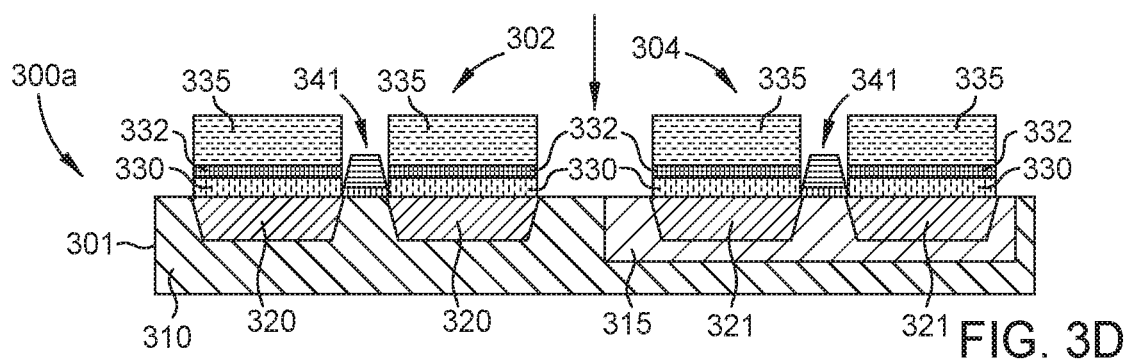

After the deposition of the silicide layer 330 and the nitride layer 332, a metal contact layer 335 is deposited over each of the PMOS and NMOS source/drain regions 320, 321 during a fourth operation 508. The contact metal layer 335 is shown in FIG. 3D. The metal contact layer 335 is deposited within a CVD process chamber and includes the deposition of a TiN layer for wetting of the nitride layer 332 over the PMOS and NMOS source/drain regions 320, 321. The metal contact layer 335 further includes a tungsten (W), a cobalt (Co), or a copper (Cu) fill. The metal contact layer 335 is shown herein as selectively deposited over the PMOS and NMOS source/drain regions 320, 321, but in some embodiments is additionally deposited over other portions of the substrate 301.

Figure 4A:
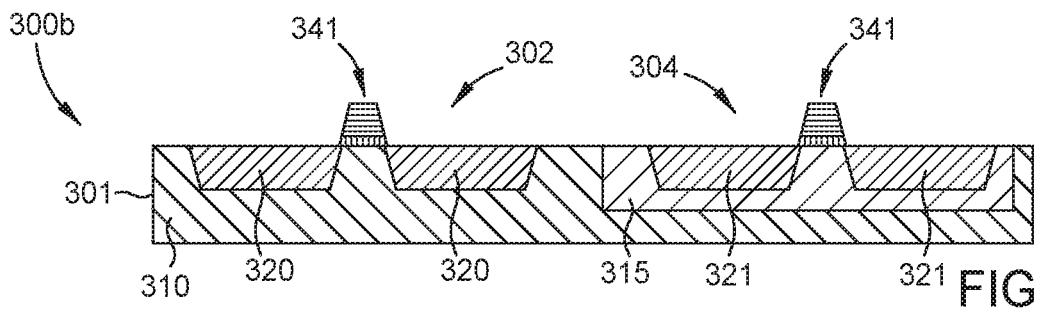
FIGS. 4A-4E are partial schematic illustrations of MOSFET device formation operations according to other embodiments of the present disclosure.

FIGS. 4A-4E are partial schematic illustrations of formation of a MOSFET device 300b according to a method 600 shown in FIG. 6. The MOSFET device 300b of FIG. 4A is similar to the MOSFET device 300a of FIG. 3A.

Figure 4B:
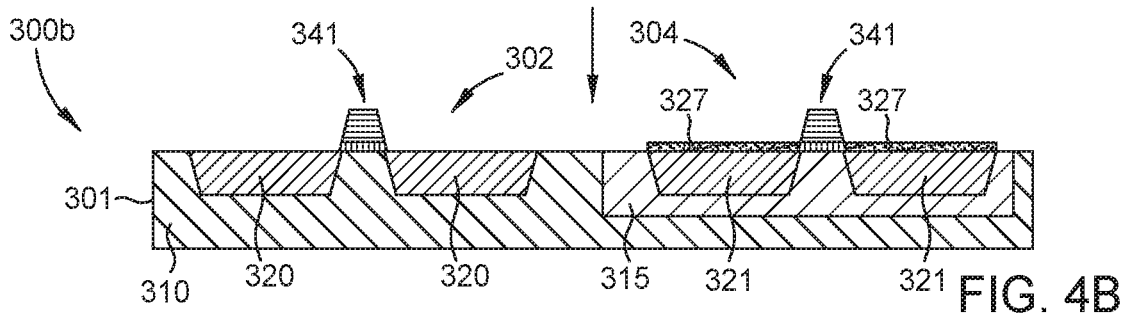

Referring to FIG. 4B and FIG. 6, a first seed layer 327 is deposited over the PMOS source/drain regions 321 in a first operation 602. Before the deposition of the first seed layer 327 over the PMOS source/drain regions 321, a dielectric coating may be formed over the NMOS source/drain regions 320 to protect the NMOS source/drain regions 320. After the NMOS source/drain regions 320 are protected by the dielectric layer, the surface of the substrate 301 is exposed to a first treatment gas within a first epitaxial deposition chamber during the first operation 602. The first treatment gas may comprise a silicon containing gas, a germanium containing gas, and a first dopant. Some examples of the silicon containing gas, the germanium containing gas, and the first dopant include one or a combination of dichlorosilane, silane, disilane, trichlorosilane, germane, digermane, germanium tetrachloride, diborane, boron trichloride, phosphine, phosphorus trichloride, arsine, tertiarybutylarsine (TBAs), or arsenic trichloride. The first treatment gas is introduced into the processing volume of a first epitaxial deposition chamber, such as the processing volume 236 of deposition chamber 200a through a process gas inlet, such as the process gas inlet 214. The first treatment gas is introduced by either one or multiple inlets. In embodiments described herein, the first treatment gas is introduced using multiple process gas inlets and flown parallel to the top surface of the substrate 301. As the first treatment gas is flown into the first epitaxial deposition chamber, the silicon, germanium, and the dopant of the first treatment gas is deposited to form the first seed layer 327 (alternatively described as a first thin layer) over the PMOS source/drain regions 321. During the first operation 602, the process chamber is held at a temperature of less than about 550° C., such as less than about 500° C., such as less than about 450° C. In some embodiments, the first seed layer 327 is deposited at a temperature between about 550° C. and about 400° C., such as about 500° C. and about 400° C. The process chamber is also held at a pressure of about 5 Torr to about 300 Torr during the deposition of the first seed layer 327, such as at about 10 Torr to about 100 Torr.

The first seed layer 327 is formed to a thickness of about 1 nm to about 6 nm, such as about 2 nm to about 5 nm, such as about 2.5 nm to about 5 nm. In some embodiments, the first seed layer 327 is about half the thickness of a silicide layer 331b formed in a third operation 606, such as less than about 40% of the thickness of the silicide layer 331b. The first seed layer 327 is deposited using an epitaxial deposition process and is therefore selectively deposited onto the PMOS source/drain regions 321. The first seed layer 327 includes a composition of about 5%-75% germanium, such as about 10% to about 60% germanium, such as about 10% to about 50% germanium, such as about 10% to about 40% germanium, such as about 10% to about 30% germanium. The germanium concentration within the first silicon-germanium (SiGe) seed layer has been determined to allow silicidation for both PMOS and NMOS source/drain regions 320, 321. The germanium concentration is chosen to improve silicide film morphology/uniformity with reduced agglomeration of germanium. The germanium concentration is also chosen to meet contact resistance reduction specifications at the interface for both NMOS and PMOS devices. The first seed layer 327 of FIG. 4B, is a first doped seed layer and includes silicon, germanium and a first dopant. The first dopant may be a boron dopant, such that the first seed layer 327 comprises a silicon-germanium-boron layer (SiGeB). The first seed layer 327 comprises a dopant concentration of about $5\times10^{19}$ atoms/cm$^3$ to about $1\times10^{22}$ atoms/cm$^3$, such as about $1\times10^{20}$ atoms/cm$^3$ to about $1\times10^{21}$ atoms/cm$^3$.

After the deposition of the first seed layer 327 during the first operation 602, the flow of the treatment gas may be ceased and the process volume purged. The process volume may be pumped to a transfer pressure and the substrate 301 may be removed from the first epitaxial deposition chamber, such as the deposition chamber 200a. The protective dielectric layer (not shown) may then be etched away from over the NMOS source/drain regions 320 before a similar protective dielectric layer (not shown) is deposited over the PMOS source/drain regions 321 within a process chamber. The substrate 301 may then be moved to a second epitaxial deposition chamber for a second operation 604.

In the second operation 604, a second seed layer 326 is deposited over the NMOS source/drain regions 320. During the second operation 604, the surface of the substrate 301 is exposed to a second treatment gas within the second epitaxial deposition chamber. The second treatment gas may comprise a silicon containing gas, a germanium containing gas, and a second dopant. Some examples of the silicon containing gas, the germanium containing gas, and the second dopant include one or a combination of dichlorosilane, silane, disilane, trichlorosilane, germane, digermane, or germanium tetrachloride. The second treatment gas is introduced into the processing volume of the second epitaxial deposition chamber, such as the processing volume 236 of the deposition chamber 200a through a process gas inlet, such as the process gas inlet 214. The second treatment gas is introduced by either one or multiple inlets. In embodiments described herein the second treatment gas is introduced using multiple process gas inlets and flown parallel to the top surface of the substrate 301. As the second treatment gas is flown into the second epitaxial deposition chamber, the silicon, germanium, and the second dopant of the second treatment gas is deposited, as described in the second operation 604, to form the second seed layer 326 (alternatively described as a second thin layer) over the NMOS source/drain regions 320. During the second operation 604, the process chamber, is held at a temperature of less than about 550° C., such as less than about 500° C., such as less than about 450° C. In some embodiments, the second seed layer 326 is deposited at a temperature between about 550° C. and about 400° C., such as about 500° C. and about 400° C. The second process chamber is also held at a pressure of about 5 Torr to about 300 Torr during the deposition of the second seed layer 326, such as at about 10 Torr to about 100 Torr.

Figure 4C:
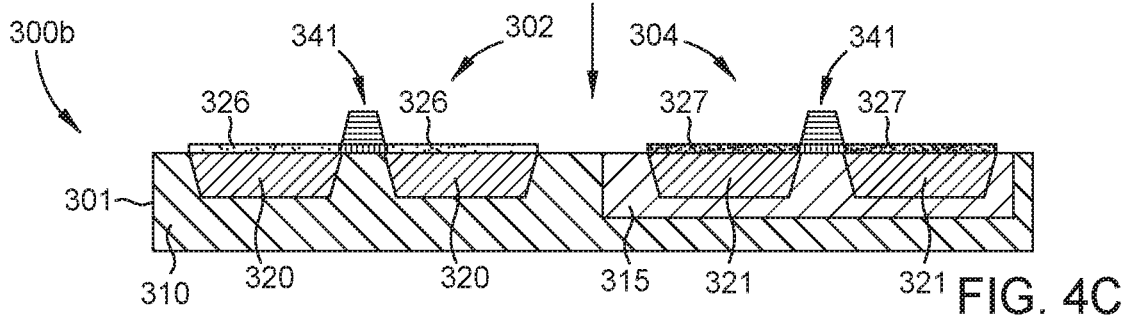

The second seed layer 326 is formed to a thickness of about 1 nm to about 6 nm, such as about 2 nm to about 5 nm, such as about 2.5 nm to about 5 nm. In some embodiments the second seed layer 326 is about half the thickness of the silicide layer 331a formed in third operation 606, such as less than about 40% of the thickness of the silicide layer 331a. The second seed layer 326 is deposited using an epitaxial deposition process and is therefore selectively deposited onto the NMOS source/drain regions 320. The second seed layer 326 includes a composition of about 5%-75% germanium, such as about 10% to about 60% germanium, such as about 10% to about 50% germanium, such as about 10% to about 40% germanium, such as about 10% to about 30% germanium. The second seed layer 326 of FIG. 4C and FIG. 6 is a second doped seed layer and includes silicon, germanium and a second dopant. The second dopant may be a phosphorous dopant or an arsenic dopant, such that the second seed layer 326 comprises a silicon-germanium-phosphorous layer (SiGeP). The second seed layer 326 comprises a dopant concentration of about $5\times10^{19}$ atoms/cm$^3$ to about $1\times10^{22}$ atoms/cm$^3$, such as about $1\times10^{20}$ atoms/cm$^3$ to about $1\times10^{21}$ atoms/cm$^3$.

The first seed layer 327 and the second seed layer 326 may be deposited separately to enable doping of the seed layers with boron, phosphorous, carbon, germanium, gallium, tin, arsenic, or other dopant materials. Doping of the NMOS source/drain regions 320 and the PMOS source/drain regions 321 may be used to reduce resistor-capacitor needs and improve contact resistance between the deposited layers. The germanium concentration between the first seed layer 327 and the second seed layer 326 is comparable to ensure silicidation occurs on both NMOS and PMOS source/drain regions simultaneously. In comparison to the major role of Ge atoms in seed layers, dopant atoms (such as phosphorous, arsenic, and boron) play a minor role in silicide nucleation and formation.

After the deposition of the second seed layer 326, the protective dielectric coating over the PMOS source/drain regions 321 is removed via etching and both the PMOS source/drain regions 321 and the NMOS source/drain regions 320 are uncovered as shown in FIG. 4C.

In some embodiments, the deposition order of the first seed layer 327 and the second seed layer 326 are switched, such that the second seed layer 326 is deposited on the NMOS source/drain regions 320 before the first seed layer 327 is deposited on the PMOS source/drain regions 321. Therefore, the first operation 602 and the second operation 604 are switched, such that the first operation 602 is performed after the second operation 604 as described above. This would also mean that the protective dielectric coating and the removal of the protective dielectric coating over both the NMOS source/drain regions 320 and the PMOS source/drain regions 321 would be in reverse order.

During the third operation 606, the substrate 301 is exposed to a silicide formation gas. The silicide formation gas may include a combination of silicon, germanium, and a metal material. The third operation 606 is similar to the second operation 504 of the formation method 500 of FIG. 5. The metal material may be any one of titanium, nickel, cobalt, platinum, or an alloy thereof. The silicide formation gas is introduced at a temperature of less than about 500° C., such as less than about 450° C., such as less than about 400° C. The third operation 606 as described herein is performed in one of the first epitaxial deposition chamber, the second epitaxial deposition chamber, or a CVD process chamber. The process chamber is also held at a pressure of about 3 Torr to about 300 Torr during the exposure to the silicide formation gas, such as at about 5 Torr to about 100 Torr.

Figure 4D:
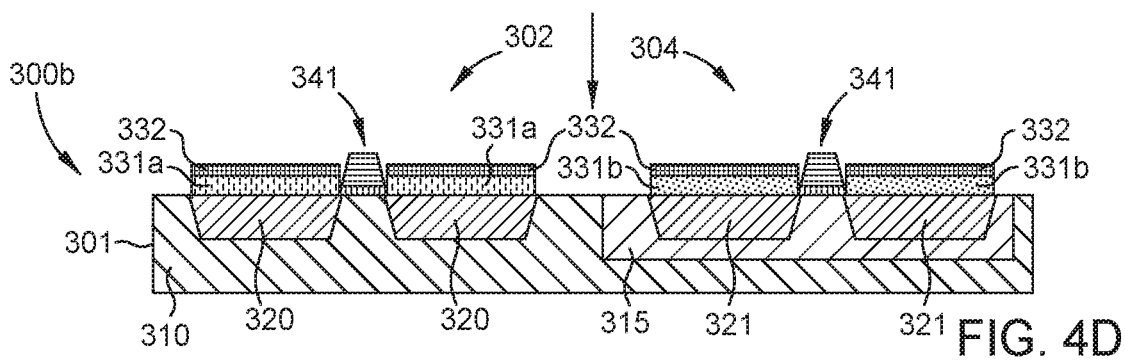

As the silicide formation gas is flown into the process chamber, the silicon, germanium, and the metal material of the silicide formation gas are deposited. As shown in FIG. 4D, a silicide layer 331a, 331b is formed over each of the NMOS source/drain regions 320 and the PMOS source/drain regions 321 after the full reaction and consumption of each of the first and second seed layers 327, 326. Each of the NMOS silicide layer 331a formed over the NMOS source/drain regions 320 and the PMOS silicide layer 331b formed over the PMOS source/drain regions 321 are formed simultaneously. The silicide layers 331a, 331b fully consume each of the first seed layer 327 and the second seed layer 326 during formation. The silicide layer 331b deposited over the PMOS source/drain regions 321 consumes the first seed layer 327 and the silicide layer 331a deposited over the NMOS source/drain regions 320 consumes the second seed layer 326. The PMOS source/drain regions 321 and the NMOS source/drain regions 320 may be partially reacted and consumed during silicidation after the first and second seed layers 327, 326 are fully reacted and consumed by the metal source The silicide layers 331a, 331b after formation are doped differently depending upon the makeup of the seed layer which it absorbed.

The silicide layers 331b, 331a as shown in FIG. 4D consume the first and second seed layers 327, 326 respectively fully. The silicide layers 331a, 331b are selectively deposited onto each of the NMOS source/drain regions 320 and the PMOS source/drain regions 321 simultaneously. The simultaneous deposition of the silicide layers 331a, 331b assists in obtaining similar silicide thicknesses and properties over both the NMOS source/drain regions 320 and the PMOS source/drain regions 321. Simultaneous deposition of the silicide layers 331a, 331b additionally reduces the number of process steps for forming the MOSFET device 300b.

The silicide layers 331a, 331b are formed to a thickness of about 4 nm to about 12 nm, such as about 5 nm to about 10 nm, such as about 6 nm to about 9 nm. In some embodiments the silicide layers 331a, 331b are about twice the thickness of the seed layers 326, 327 formed in first operation 602 and the second operation 604, such as greater than about 200% of the thickness of the seed layers 326, 327. The silicide layers 331a, 331b are deposited using either an epitaxial deposition process or a CVD process and are therefore selectively deposited onto the seed layers 326, 327 over both the NMOS source/drain regions 320 and the PMOS source/drain regions 321. In some embodiments, the silicide layers 331a, 331b are formed using a plasma CVD process, but the plasma CVD process is non-selective. The silicide layers 331a, 331b include a composition of about 35% to about 65% metal material, such as about 40% to about 60% metal material, such as about 45% to about 55% metal material, such as about 50% metal material. The silicide layers 331a, 331b may further include about 5%-65% germanium, such as about 25% to about 45% germanium, such as about 25% to about 40% germanium. The silicide layers 331a, 331b may further include about 5%-65% silicon, such as about 25% to about 45% silicon, such as about 25% to about 40% silicon. The silicide layers 331a, 331b of FIG. 4D and FIG. 6 are titanium containing layers, such as Ti—Si—Ge layers.

Figure 4E:
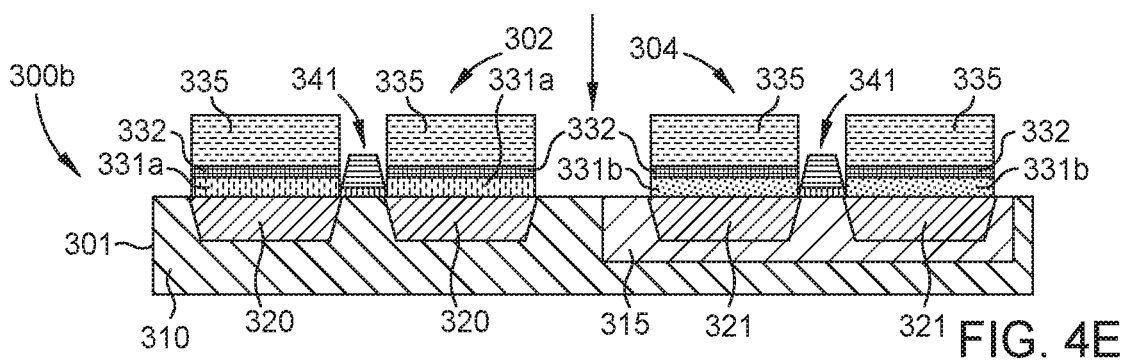

The fourth operation 608 of the formation method 600 of FIG. 6 is similar to the third operation 506 of the formation method 500 of FIG. 5. The fourth operation 608 similarly forms the nitride layer 332 on top of the silicide layers 331a, 331b as shown in FIG. 4D. The fifth operation 610 of the formation method 600 of FIG. 6 is similar to the fourth operation 508 of the formation method 500 of FIG. 5. The fifth operation 610 includes the formation of the metal contact layer 335 over each of the PMOS and NMOS source/drain regions 320, 321 as shown in FIG. 4E.

Figure 7A:
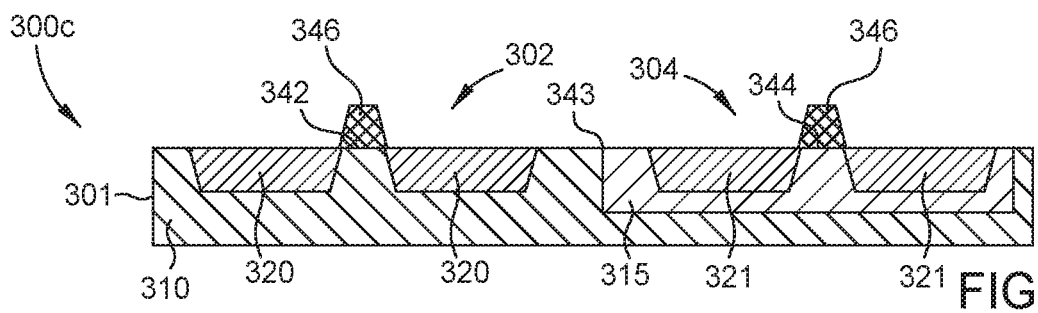
FIGS. 7A-7E are partial schematic illustrations of MOSFET device formation according to yet other embodiments of the present disclosure.
Figure 7B:
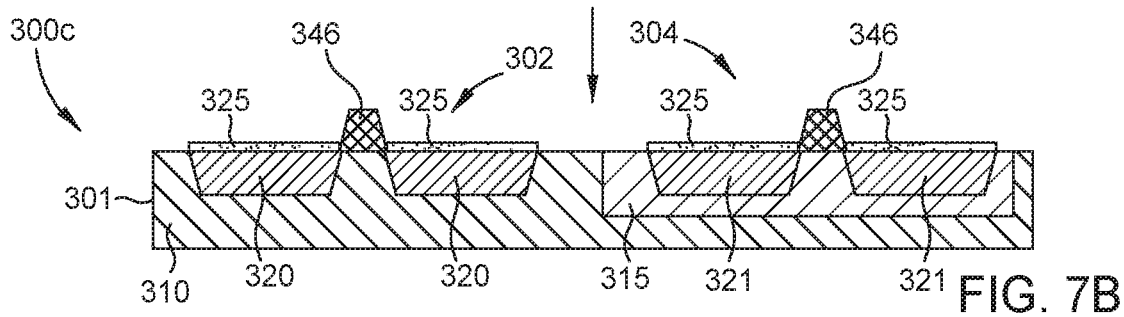

FIG. 9 shows a method used to form a MOSFET device 300c as shown in FIGS. 7A-7E according to yet other embodiments of the present disclosure. The MOSFET device 300c of FIG. 7A is shown after the formation of a dummy gate 346, NMOS source/drain regions 320, and PMOS source/drain regions 321 within a substrate 301. The dummy gate 346 as described herein is used to define the source/drain regions of the NMOS and the PMOS transistors. The dummy gate 346 is removed and replaced with a gate 341 at a later processing operation. The NMOS source/drain regions 320 and the PMOS source/drain regions 321 are similar to those described with respect to FIGS. 3A-3D.

The dummy gate 346 is disposed on the first surface 342 of the substrate 301 between the NMOS source/drain regions 320. Another dummy gate 346 is disposed on the second surface 344 of the substrate 301 between the PMOS source/drain regions 321. The dummy gates 346 include a silicon-based material. The silicon-based material of the dummy gates 346 is disposed on the first surface 342 and the second surface 344 between both the NMOS and the PMOS source/drain regions 320, 321. The silicon-based material may include polycrystalline silicon, amorphous silicon, microcrystal silicon, or combinations thereof.

The first operation 902 of the MOSFET formation method 900 is similar to the first operation 502 of the formation method 500 described with respect to FIGS. 3B and 5. During the first operation 902, the seed layer 325 is formed on the NMOS source/drain regions 320 and the PMOS source/drain regions 321. The seed layer 325 is described with reference to FIG. 3B and FIG. 5 in greater detail above. The temperature of the deposition chamber during the formation of the seed layer 325 is less than 800° C., such as less than 750° C., such as less than 700° C., such as about 500° C. to about 700° C. The elevated temperature may be utilized during the first 902 as the dummy gates 346 do not limit the maximum deposition temperature to a temperature of less than 500° C. During operations wherein the gate 341 is already formed on the substrate 301 before the deposition of the seed layer 325, the temperature of deposition is lower to prevent the gate 346 from being damaged.

Figure 7C:
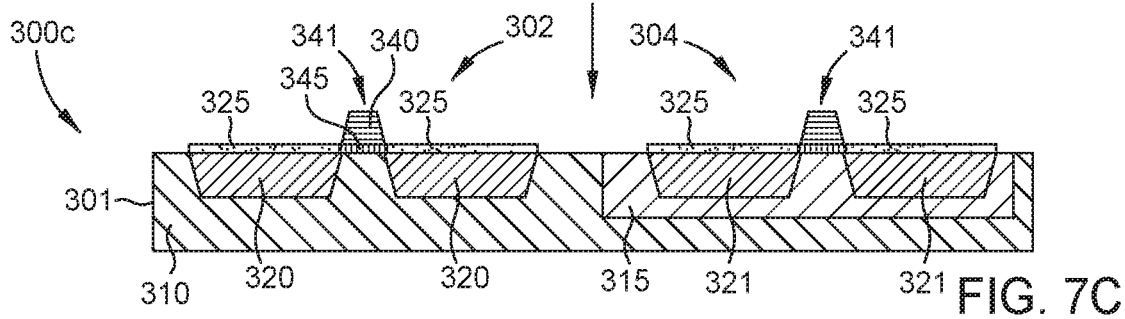

After the formation of the seed layer 325 during the first operation 902, the substrate 301 is removed from the epitaxial deposition chamber and placed into an etch chamber. In some embodiments, the etch chamber may be a cleaning chamber. During a second operation 904, the dummy gate 346 is etched away within the etch chamber. The dummy gate 346 is etched away such that the first surface 342 and the second surface 344 are exposed. The dummy gates 346 are removed and replaced by gates 341 as shown in FIG. 7C, which include an intermediate layer 345 and a gate device 340. The gates 341 are formed in the second operation 904 using multiple process steps and are described in detail with respect to FIG. 3A.

Figure 7D:
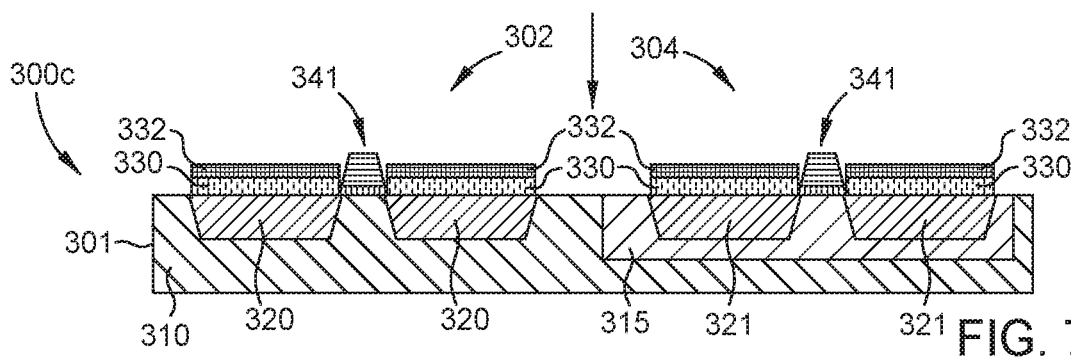

After the formation of the gates 341 during the second operation 904, the substrate 301 is transferred to one of the first epitaxial deposition chamber, the second epitaxial deposition chamber, or the CVD chamber. After transferring the substrate 301 into the appropriate deposition chamber, a third operation 906 is performed, in which the substrate is exposed to a silicide formation gas. The silicide formation gas is similar to that described with respect to FIG. 3C and the second operation 504 of the formation method 500 of FIG. 5. After the introduction of the silicide formation gas, a silicide layer 330 is formed over each of the NMOS source/drain regions 320 and the PMOS source/drain regions 321 during the third operation 906. The silicide layer 330 is shown in FIG. 7D and consumes the seed layer 325 fully. The silicide layer 330 is selectively deposited onto each of the NMOS source/drain regions 320 and the PMOS source/drain regions 321 simultaneously.

After the formation of the silicide layer 330 during the third operation 906, the substrate is exposed to a nitride formation gas and a nitride layer 332 is formed during a fourth operation 908. The fourth operation 908 is similar to the nitridation process described with respect to the third operation 506 of the formation method 500 of FIG. 5.

Figure 7E:
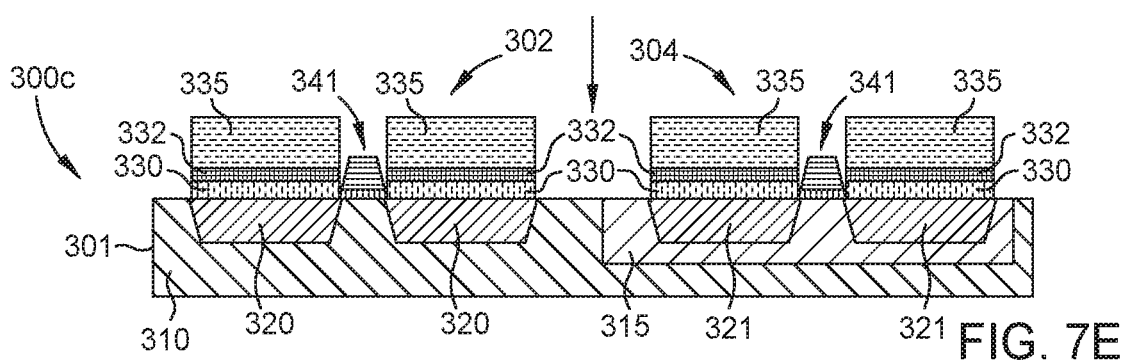

After the nitride layer 332 is formed, a metal contact layer 335 is deposited over each of the PMOS and NMOS source/drain regions 320, 321 during a fifth operation 910. The contact metal layer 335 is shown in FIG. 7E. The contact metal layer 335 and the deposition of the contact metal layer 335 are similar to that described with respect to FIG. 3D and the fourth operation 508 of FIG. 5.

Figure 8A:
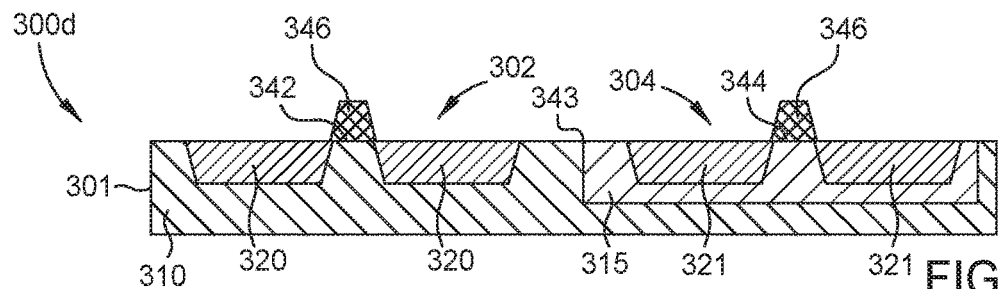
FIGS. 8A-8F are partial schematic illustrations of MOSFET device formation according to additional embodiments of the present disclosure.

FIGS. 8A-8F are partial schematic illustrations of the formation of a MOSFET device 300d according to formation method 1000 of FIG. 10. The MOSFET device 300d of FIG. 8A is similar to the MOSFET device 300c of FIG. 7A.

Figure 8B:
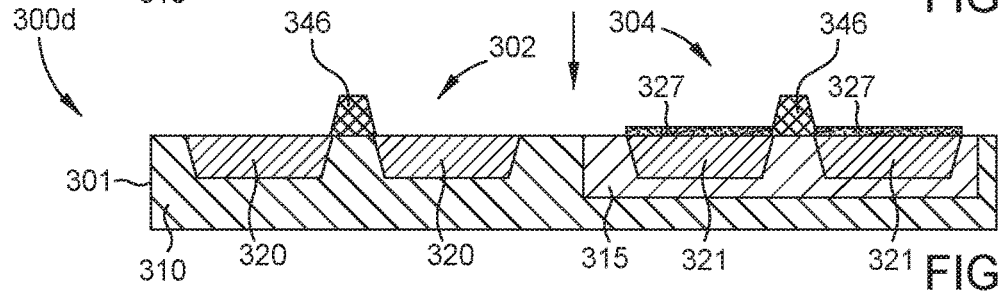

FIG. 8B shows the MOSFET device 300d after the deposition of a first seed layer 327. The first seed layer 327 deposition is performed during a first operation 1002 of the formation method 1000 shown in FIG. 10. During the first operation 1002, the surface of the substrate 301 is exposed to a first treatment gas within a first epitaxial deposition chamber. The deposition of the first seed layer 327 is similar to that described with respect to the first operation 602 of the formation method 600 of FIG. 6 as shown in FIG. 4B. In some embodiments of depositing the first seed layer 327 as described herein, the temperature during deposition is higher than that described in the formation method 600 of FIG. 6. The temperature of the deposition chamber during the formation of the first seed layer 327 is less than 800° C., such as less than 750° C., such as less than 700° C., such as about 500° C. to about 700° C. The elevated temperature is utilized as the dummy gates 346 do not limit the maximum deposition temperature to a temperature of less than 500° C. During operations wherein the gate 341 is already formed on the substrate 301 before the deposition of the first seed layer 327, the temperature of deposition is lower to prevent the gate 346 from being damaged.

Figure 8C:
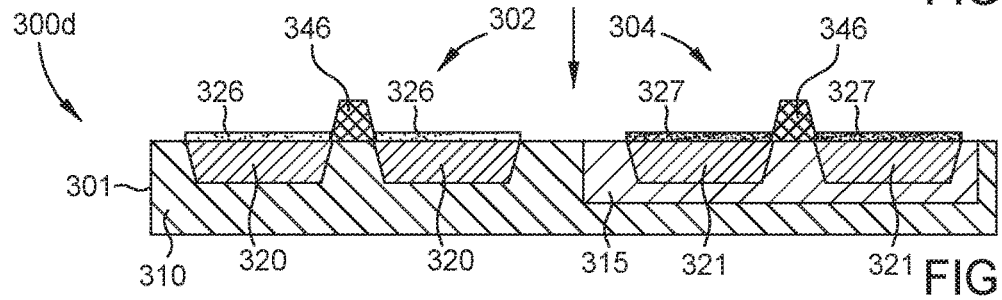

After the deposition of the first seed layer 327, the substrate 301 is transferred to a second epitaxial deposition chamber and a second seed layer 326 is deposited by introducing a second treatment gas into a second epitaxial deposition chamber during a second operation 1004. After and during the introduction of the second treatment gas, the second seed layer 326 is formed as shown in FIG. 8C. The second seed layer 326 is similar to that described herein with respect to FIG. 4B and the second operation 604 of FIG. 6. Similar to the formation of the first seed layer 327 during the first 1002, the second operation 1004 is performed at a temperature of less than 800° C., such as less than 750° C., such as less than 700° C., such as about 500° C. to about 700° C.

As previously described with respect to the first operation 602 and the second operation 604 of FIG. 6, the deposition order of the first seed layer 327 and the second seed layer 326 may also be switched, such that the second seed layer 326 is deposited on the NMOS source/drain regions 320 before the first seed layer 327 is deposited on the PMOS source/drain regions 321. Therefore, the first operation 1002 and the second operation 1004 are switched, such that the first operation 1002 is performed after the second operation 1004 as described above. This would also mean that the protective dielectric coating and the removal of the protective dielectric coating over both the NMOS source/drain regions 320 and the PMOS source/drain regions 321 would be in reverse order.

Figure 8D:
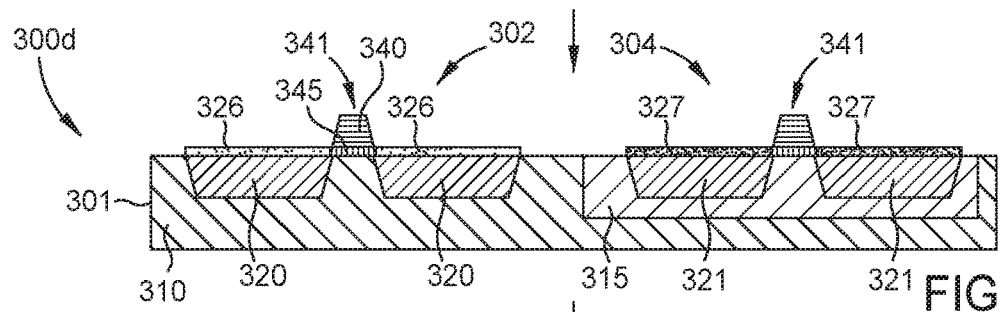

After the deposition of the second seed layer 326, a third operation 1006 is performed. During the third operation 1006, the substrate 301 is removed from the second epitaxial deposition chamber and transferred to an etch chamber. While in the etch chamber, the dummy gate 346 is removed. The dummy gate 346 is then replaced with a gate 341 which includes an intermediate layer 345 and a gate device 340 as shown in FIG. 8D. The removal of the dummy gate 346 and the replacement with the gate 341 is described in greater detail with respect to FIG. 7C and the second operation 904 of FIG. 9.

Figure 8E:
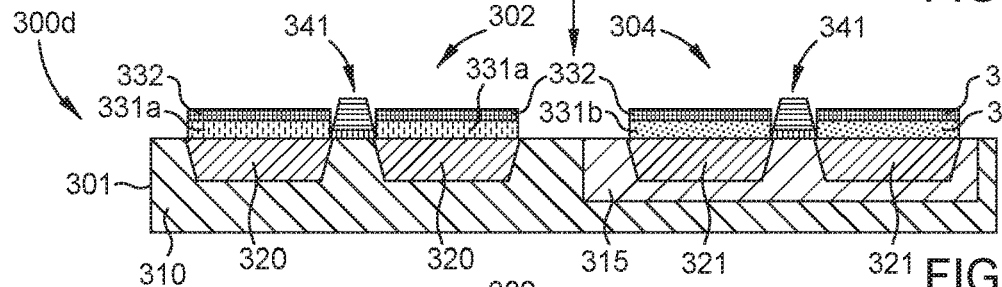

After the formation of the gate 341 during the third operation 1006, the substrate 301 is transferred to one of the first epitaxial deposition chamber, the second epitaxial deposition chamber, or the CVD chamber. After transferring the substrate 301 into the appropriate deposition chamber, the fourth operation 1008 of exposing the substrate to a silicide formation gas is performed. The silicide formation gas is similar to that described with respect to FIG. 3C and the second operation 504 of the formation method 500 of FIG. 5. After the introduction of the silicide formation gas, silicide layers 331a, 331b are formed over the NMOS source/drain regions 320 and the PMOS source/drain regions 321. An NMOS silicide layer 331a is formed over each of the NMOS source/drain regions 320 and a PMOS silicide layer 331b is formed over each of the PMOS source/drain regions 321 during the fourth operation 1008. The silicide layers 331a, 331b are shown in FIG. 8E and consume the seed layers 326, 327 fully. The silicide layers 331a, 331b are selectively deposited onto each of the NMOS source/drain regions 320 and the PMOS source/drain regions 321 simultaneously.

After the formation of the silicide layers 331a, 331b during the fourth operation 1008, the substrate is exposed to a nitride formation gas and a nitride layer 332 is formed during a fifth operation 1010 as shown in FIG. 8E. The fifth operation 1010 is similar to the nitridation process described with respect to the third operation 506 of the formation method 500 of FIG. 5.

Figure 8F:
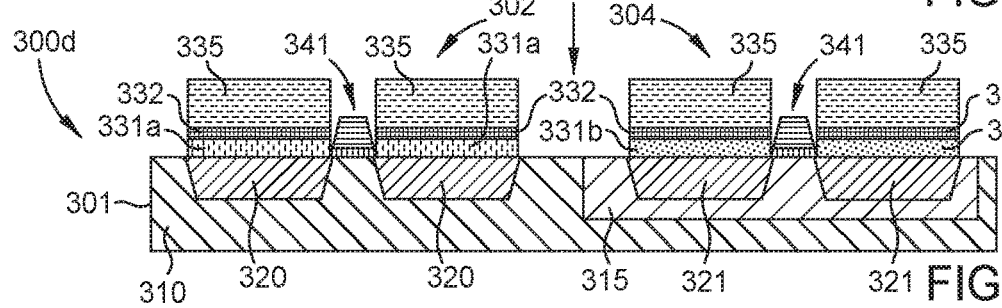

After the nitride layer 332 is formed, during a sixth operation 1012, a metal contact layer 335 is deposited over each of the PMOS and NMOS source/drain regions 320, 321. The contact metal layer 335 is shown in FIG. 8F. The contact metal layer 335 and the deposition of the contact metal layer 335 are similar to that described with respect to FIG. 3D and the fourth operation 508 of FIG. 5.

Embodiments described herein generally relate to the formation of MOSFET devices. The MOSFET devices include both an NMOS and a PMOS device. In the past it has been difficult to grow thick silicide films with good morphology and uniformity over both the NMOS and the PMOS source/drain regions. Described herein are methods for forming a MOSFET device in which a single silicide formation step is performed and a silicide is deposited over each of the NMOS source/drain regions and the PMOS source/drain regions simultaneously. Simultaneous deposition is enabled at least in part by the formation of a silicon-germanium seed layer. In some embodiments the silicon-germanium seed layer may be formed as a first doped silicon-germanium seed layer formed over the PMOS source/drain regions and a second doped silicon-germanium seed layer formed over the NMOS source/drain regions. Dopants are utilized to reduce contact resistance across the barriers between the layers, but increases the complexity of device formation.

While the foregoing is directed to embodiments of the present disclosure, other and further embodiments of the disclosure may be devised without departing from the basic scope thereof, and the scope thereof is determined by the claims that follow.

What is claimed is:

1. A method of processing a substrate comprising:
positioning a substrate having an n-channel metal-oxide semiconductor (NMOS) device and a p-channel metal-oxide semiconductors (PMOS) device disposed thereon into a first processing chamber;
selectively depositing a first seed layer over an NMOS source/drain region of the NMOS device and a PMOS source/drain region of the PMOS device, the first seed layer comprising both silicon and germanium;
depositing, in a second processing chamber, a second seed layer over a PMOS source/drain region of the PMOS device, the second seed layer comprising silicon; and
forming, through chemical vapor deposition, a metal silicide simultaneously over the NMOS source/drain region and the PMOS source/drain region after depositing the first and second seed layers.

2. The method of claim 1, wherein the first seed layer is a SiGe layer with a molecular germanium concentration of about 5% to about 75% of the first seed layer.

3. The method of claim 2, wherein the first seed layer is deposited by a silicon and germanium containing precursor.

4. The method of claim 1, wherein the first seed layer has a thickness of less than 5 nm.

5. The method of claim 1, wherein the first seed layer is deposited during a thermal deposition process.

6. The method of claim 1, wherein the first seed layer is consumed during the depositing of the metal silicide.

7. The method of claim 6, wherein the metal silicide comprises silicon, germanium, and at least one of titanium, nickel, cobalt, or platinum.

8. The method of claim 1, wherein a contact metal layer is deposited after the deposition of the metal silicide and on the metal silicide.

9. A method of processing a substrate comprising:
positioning a substrate having an n-channel metal-oxide semiconductor (NMOS) device and a p-channel metal-oxide semiconductors (PMOS) device disposed thereon into a first processing chamber;
selectively depositing a first seed layer over an NMOS source/drain region of the NMOS device within the first processing chamber, the first seed layer comprising both silicon and germanium;

selectively depositing, within a second processing chamber, a second seed layer over a PMOS source/drain region of the PMOS device, the second seed layer comprising both silicon and germanium; and depositing a metal silicide simultaneously over the NMOS source/drain and the PMOS source region after depositing the first seed layer and the second seed layer, the first seed layer and the second seed layer being consumed during the deposition of the metal silicide.

10. The method of claim 9, wherein both of the first seed layer and the second seed layer comprise silicon, germanium, and one or more dopants.

11. The method of claim 10, wherein the one or more dopants comprise boron, phosphorous, carbon, gallium, arsenic, or tin.

12. The method of claim 11, wherein the first seed layer further comprises phosphorous and the second seed layer further comprises boron.

13. The method of claim 9, further comprising forming one or more gate structures on the substrate.

14. The method of claim 13, wherein the first seed layer is deposited at a temperature of less than 500° C. and the one or more gate structures are formed before the deposition of the first seed layer.

15. The method of claim 13, wherein the first seed layer is deposited at a temperature of about 500° C. to about 750° C. and the one or more gate structures are formed after the deposition of the first seed layer and before the deposition of the metal silicide.

16. A system for substrate processing comprising:

a first process chamber;

a robot;

a second process chamber; and a controller, the controller configured to perform a method comprising:

positioning, by the robot, a substrate having an n-channel metal-oxide semiconductor (NMOS) device and a p-channel metal-oxide semiconductors (PMOS) device disposed thereon onto the first substrate support in the first process chamber;

selectively depositing a first seed layer over an NMOS source/drain region of the NMOS device within the first process chamber, the first seed layer comprising both silicon and germanium;

selectively depositing, within the second processing chamber, a second seed layer over a PMOS source/drain region of the PMOS device, the second seed layer comprising both silicon and germanium; and depositing a metal silicide simultaneously over the NMOS source/drain and the PMOS source region after depositing the first seed layer and the second seed layer, the first seed layer and the second seed layer being consumed during the deposition of the metal silicide.

* * * * *